(12) United States Patent
Weckx et al.

(10) Patent No.: US 11,164,942 B1
(45) Date of Patent: Nov. 2, 2021

(54) METHOD FOR FORMING NANOSHEET TRANSISTOR STRUCTURES

(71) Applicant: IMEC VZW, Leuven (BE)

(72) Inventors: Pieter Weckx, Bunsbeek (BE); Julien Ryckaert, Schaerbeek (BE); Eugenio Dentoni Litta, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/885,040

(22) Filed: May 27, 2020

(51) Int. Cl.
| | | |
|---|---|---|
| H01L 21/8234 | (2006.01) | |
| H01L 27/088 | (2006.01) | |
| H01L 29/76 | (2006.01) | |
| H01L 29/423 | (2006.01) | |
| H01L 29/417 | (2006.01) | |
| H01L 29/06 | (2006.01) | |
| H01L 29/10 | (2006.01) | |
| H01L 29/08 | (2006.01) | |
| H01L 21/02 | (2006.01) | |
| H01L 21/306 | (2006.01) | |
| H01L 21/8238 | (2006.01) | |
| H01L 29/51 | (2006.01) | |
| H01L 21/311 | (2006.01) | |
| H01L 29/66 | (2006.01) | |

(52) U.S. Cl.
CPC .... *H01L 29/0673* (2013.01); *H01L 21/02532* (2013.01); *H01L 21/30604* (2013.01); *H01L 21/31111* (2013.01); *H01L 21/823807* (2013.01); *H01L 21/823814* (2013.01); *H01L 21/823821* (2013.01); *H01L 21/823828* (2013.01); *H01L 29/0847* (2013.01); *H01L 29/1037* (2013.01); *H01L 29/42392* (2013.01); *H01L 29/513* (2013.01); *H01L 29/66545* (2013.01); *H01L 29/66795* (2013.01)

(58) Field of Classification Search
CPC ......... H01L 29/78696; H01L 29/66545; H01L 29/66742; H01L 29/4966; H01L 21/28194; H01L 29/0673
See application file for complete search history.

(56) References Cited

U.S. PATENT DOCUMENTS

| | | | |
|---|---|---|---|
| 2016/0118480 A1 | 4/2016 | Xie et al. | |
| 2019/0189769 A1* | 6/2019 | Basker | H01L 29/66553 |
| 2020/0303500 A1* | 9/2020 | Loubet | H01L 29/785 |
| 2020/0365586 A1* | 11/2020 | Shin | H01L 27/0886 |

OTHER PUBLICATIONS

Weckx et al. "Stacked Nanosheet Fork Architecture for SRAM Design and Device Co-optimization Toward 3NM", IEEE, IEDM17, p. 505 to 508.

* cited by examiner

Primary Examiner — Brian Turner
(74) Attorney, Agent, or Firm — Moser Taboada (57) ABSTRACT

According to an aspect of the present inventive concept there is provided a method for forming a first and a second nanosheet transistor structure, each comprising a source, a drain, and a channel extending between the source and the drain in a first direction, and a gate extending across the channel, wherein the first and second nanosheet transistor structures are spaced apart in a second direction, transverse to the first direction, by an insulating wall extending in the first direction.

20 Claims, 8 Drawing Sheets

METHOD FOR FORMING NANOSHEET TRANSISTOR STRUCTURES

TECHNICAL FIELD

The present inventive concept relates to methods for forming first and second nanosheet transistor structures.

BACKGROUND

In the strive to provide even more power- and area-efficient circuit designs, new transistor devices are being developed.

Horizontal channel field effect transistor (FET) devices include the FinFET, which has a gate straddling a fin-shaped channel portion. Scaling of the minimum contacted gate pitch (CGP) and metal pitch (MP) has for some time allowed a corresponding scaling of finFET devices. Despite challenges in among others patterning technology at smaller critical dimensions (CDs) standard cell scaling may still be achieved by track height (TH) reduction through fin depopulation, self-aligned gate contacts (SAGC) and gate cut last in replacement metal gate (RMG), to give a few examples.

However, even at a single fin device standard cell architecture, cell height scaling will be limited by the separation between an adjacent pair of transistors. For a complementary transistor pair, the separation may be referred to as the PN separation. This (PN) separation is governed by e.g. mask edge placement error (EPE), lateral etch control during metal gate formation and the risk of merging P and N epitaxially grown source and drain (EPI) due to lateral growth.

Horizontal or lateral gate-all-around nanosheet (GAA-NSH) transistor devices, which offer better electrostatic control over FinFET, favor CGP scaling but device or PN separation remains challenging. Lateral etch control during RMG may even be a greater concern for NSH as more PN margin is needed for larger sheet widths, limiting further cell height scaling.

SUMMARY

In view of the above, an objective of the present inventive concept is to provide a method allowing for shorter separation between transistor devices. Further and alternative objectives may be understood from the following.

According to an aspect of the present inventive concept there is provided a method for forming a first and a second nanosheet transistor structure, each comprising a source, a drain, and a channel extending between the source and the drain in a first direction, and a gate extending across the channel, wherein the first and second nanosheet transistor structures are spaced apart in a second direction, transverse to the first direction, by an insulating wall extending in the first direction, and the method comprising:

forming a first stack and a second stack separated by a trench extending in the first direction, each stack comprising a nanosheet intermediate a pair of sacrificial layers, wherein each nanosheet is formed of a channel material and each sacrificial layer is formed a sacrificial material;

forming a recess in the first and second stacks, between the respective pairs of sacrificial layers, comprising etching back a respective inner sidewall surface of the nanosheets from the trench;

forming the insulating wall between the first stack and the second stack, comprising depositing an insulating material filling the trench and the recesses;

forming, at the first stack, the source and the drain of the first nanosheet transistor structure, and, at the second stack, the source and the drain of the second nanosheet transistor structure;

forming a respective channel portion of the first and second nanosheet transistor structure, comprising removing sacrificial material from the first and second stacks to expose upper and lower surfaces of a nanosheet portion of the respective nanosheets, each nanosheet portion having an etched-back inner sidewall surface abutting the insulating wall; and forming a respective gate stack for the first and second nanosheet transistor structures, wherein the nanosheet portion of the first nanosheet transistor structure extends through the first gate stack and the nanosheet portion of the second nanosheet transistor structure extends through the second gate stack.

The inventive method allows two nanosheet (NSH) transistor structures to be formed in relative proximity to each other. The separation between the NSH transistor structures may be determined by a width of the insulating wall (along the second direction).

The insulating wall may provide physical and electrical isolation between the NSH transistor structures and the associated first and second gate stacks. The insulating wall may further simplify patterning and enable a reduced sensitivity to EPE since the gate stacks may be self-aligned with the respective channels of the NSH transistor structures. For a complementary transistor pair, this may offer further advantages during work function metal (WFM) fill and etch back in an RMG process. Furthermore, the insulating wall may reduce a risk of merging of the sources/drains of the NSH transistor structures, e.g. during N- and P-type epitaxy.

By removing the sacrificial material from the first and second stacks to expose upper and lower surfaces of the nanosheet portion of the respective first nanosheets, partially released channel portions may be formed. The wording "partially released" hereby signifies that the inner sidewall surface of the nanosheet portion/channel portion abuts (and hence is covered by) the insulating wall.

Correspondingly, each gate stack may be formed to only partially enclose or wrap around the nanosheet portions/channel portions. Hence, the first/second gate stack may be formed to surround the respective channel portion on only three sides thereof, e.g.: along the upper surface of the nanosheet portion, along the lower surface of the nanosheet portion, and along an outer sidewall surface (opposite to the inner sidewall surface) of the nanosheet portion.

Each gate stack may thus comprise a respective fork-shaped portion or structure at the transistor structures, each comprising a number of prongs, each prong extending from an outer sidewall surface of a nanosheet/channel portion, along an upper or lower surface of a nanosheet portion/channel portion, and terminating at the insulating wall.

Each gate stack (e.g. the fork-shaped portion thereof) may in other words comprise an inner edge abutting (a sidewall surface of) the insulating wall. Each gate stack/fork-shaped portion may further comprise an outer edge (opposite the inner edge) located outside of an outer sidewall surface of the associated nanosheet portion/channel portion (as seen along a direction away from the insulating wall).

By etching back a respective inner sidewall surface of the nanosheets (of the channel material) from the trench, the nanosheets (and accordingly the nanosheet portions/the channel portions) may be recessed along a width dimension (i.e. along the second direction) prior to the insulating wall formation. This enables an improved channel control due to an increased extension of the gate stack (i.e. a gate electrode thereof) with respect to (the width of) the channel. Improved channel control may be associated with improved sub-threshold swing, reduced leakage and increased drive current.

The NSH transistor structures (or as the case may be NSH-FETs) thus formed may be referred to as horizontal- or lateral-channel NSH transistor structures, owing to the horizontal or lateral orientation or the channel. I.e. the respective channels of the NSH transistor structures allow a horizontally or laterally oriented flow of charge carriers between the (horizontally spaced apart) source and drain.

The term "horizontal" or "lateral" direction/orientation is herein to be understood as a direction/orientation along/parallel to a main plane of extension, or a main surface of, a substrate supporting the NSH transistor structures. The aforementioned "first direction" and "second direction" may accordingly be referred to as a "first horizontal direction" and a "second horizontal direction", respectively.

The term "vertical" may be used to refer to a direction/orientation normal to a main plane of extension, a main surface of, a substrate supporting the NSH transistor structures. Meanwhile, terms such as "above", "upper", "top" and "below", "lower", "bottom" may be used to refer to relative positions as viewed along the vertical direction, and does hence not imply an absolute orientation of the substrate or device.

Each one of the first and the second stack may comprise an alternating arrangement of nanosheets of the channel material and sacrificial layers of the sacrificial material. Accordingly each transistor structure may be provided with a number (greater than one) of vertically distributed channel portions. The number of channel portions of the first/second NSH transistor structure may correspond to the number of nanosheets of the channel material of first/second stack. By way of example, the number of nanosheets of the channel material of each stack may be 2, 3, 4 or more. The number of nanosheets (and sacrificial layers) may generally be the same for the first and second stacks.

At least a sacrificial layer of the sacrificial layers which is intermediate a pair of the nanosheets (of channel material) may form a sacrificial nanosheet. The pair of nanosheets of channel material may hence be vertically separated by a distance corresponding to a thickness of the sacrificial nanosheet.

Forming the first and the second stack may comprise depositing (on a substrate) stack comprising a deposited nanosheet of the channel material intermediate a pair of deposited sacrificial layers, and patterning the nanosheet and sacrificial layers of the deposited stack to form the first stack and the second stack. Hence, the first and second stacks may be formed in an identical manner with respect to a number and a composition (e.g. individual layer thickness and material) of the layers and nanosheets.

The channel material may be silicon and the sacrificial material may be silicon germanium. The combination of Si and SiGe allows formation of stacked high quality epitaxial layers, and also facilitates individual processing of the nanosheets/layers (such as during channel release).

The nanosheets of the channel material may be formed with a width of in a range from 10 nm to 30 nm wherein each of the inner sidewall surfaces may be etched back from 1 nm to 4 nm.

A thickness of each nanosheet may be in a range from 3 nm to 8 nm.

The insulating wall may extend to a (vertical) level over the respective upper surfaces of the channel portions (or top channel portions if each transistor structure comprises more than one).

Each gate stack may comprise one or more gate dielectric layers. The forming of recess in the first and second stacks may comprise etching back each of the inner sidewall surfaces by a distance (along the second direction) equal to or exceeding a (combined) thickness (along the second direction) of the one or more gate dielectric layers. This may ensure that a gate electrode (e.g. gate metal) may extend along the entire width of a respective nanosheet portion/channel.

The first and second stacks may, in addition to an inner sidewall surface (facing the trench), comprise an (opposite) outer sidewall surface (facing away from the trench). Forming the recesses may comprise etching back the inner sidewall surfaces of the nanosheets while masking the outer sidewall surface of the first stack and the outer sidewall surface of the second stack. Channel thinning from both sides during the recess formation may hence be avoided. As may be appreciated etch back of an outer sidewall surface of the nanosheet facing away from the trench is not required to obtain the above-discussed improved channel control.

The method may further comprise:
prior to forming the sources and drains, forming a sacrificial gate extending across the first stack, the insulating wall, and the second stack, thereby defining a channel region of the first nanosheet transistor structure at the first stack and a channel region of the second nanosheet transistor structure at the second stack; and
prior to forming the channel portions, removing the sacrificial gate.

The sacrificial gate may act as a mask during the source and drain formation, e.g. comprising etching and epitaxy.

Forming the channel portions may comprise removing the sacrificial material from the stacks in the channel regions.

By forming the sacrificial gate, a source region and a drain region of the first NSH transistor structure may be defined at the first stack on either side of the sacrificial gate (i.e. on either side of the channel region of the first NSH transistor structure). Correspondingly, a source region and a drain region of the second NSH transistor structure may be defined at the second stack on either side of the sacrificial gate (i.e. on either side of the channel region of the second NSH transistor structure). The source and the drain of the first NSH transistor structure may be formed in the source and drain region, respectively, of the first NSH transistor structure. The source and drain of the second NSH transistor structure may be formed in the source and drain region, respectively, of the second NSH transistor structure.

The method may further comprise, on either side of the sacrificial gate, removing, from the first and second stacks, the sacrificial material and the channel material by etching. Hence, the sacrificial and channel materials may be removed from the stacks on either side of the sacrificial gate (i.e. in the source and drain regions), prior to forming the sources and drains.

The method may comprise etching back an upper surface of the first stack and the second stack to form a cut extending through the first and second layers.

The method may further comprise, subsequent to removing the sacrificial material and the channel material, forming the respective source and drain of the first and second transistor structures on either side of the sacrificial gate by epitaxy. The sources and drains may hence be formed in the source and drain regions.

The method may further comprise:

depositing a cover material covering the sources and drains and surrounding the sacrificial gate on either side; and removing the sacrificial gate to expose the first stack in a first gate trench and the second stack in a second gate trench;

wherein the gate stacks are formed in the first and second gate trenches, respectively.

The gate stacks may hence be formed in an RMG-process. The insulating wall may act as a partition between the first and second gate trenches. Moreover, the cover material may mask the sources and drains during sacrificial material removal of the channel portion formation.

The first NSH transistor structure may be a p-type FET transistor structure and the second NSH transistor structure may be an n-type field FET. The insulating wall may facilitate individual processing of the n-type and p-type FETs.

Forming the gate stacks may comprise:

forming a p-type effective work function metal, WFM, at the channel portions of the first and second nanosheet transistor structures;

removing the p-type WFM at the second channel portion while preserving the p-type WFM at the first channel portion; and subsequently forming an n-type WFM at the second channel portion.

The insulating wall facilitates a selective removal of the p-type WFM from the second channel portion, as the insulating wall may act as a lateral etch barrier counteracting lateral over-etching of the p-type WFM at the first channel portion. Furthermore, the insulating wall may physically and electrically separate the p-type WFM and n-type WFM.

The first and second channel portions are exposed in a first and second gate trench, respectively, formed by removing the sacrificial gate (e.g. in the manner discussed above). The first and second gate trenches may be separated by the insulating wall. Accordingly, the p-type WFM may first be deposited in the first and the second gate trench, and then removed from the second gate trench. The n-type WFM may subsequently be deposited in at least the second gate trench, optionally also in the first gate trench on the p-type WFM.

Removing the p-type WFM from the second gate trench may comprise forming an etch mask above the first gate trench and etching the p-type WFM in the second gate trench while the etch mask and the insulating wall counteracts etching of the p-type WFM in the first gate trench. The etch mask and the insulating wall may hence together mask the p-type WFM in the first gate trench from the p-type WFM etchants.

According to a second aspect, there is provided a method for forming a first and a second nanosheet transistor structure, each comprising a source, a drain, and a channel extending between the source and the drain in a first direction, and a gate extending across the channel, wherein the first and second nanosheet transistor structures are spaced apart in a second direction, transverse to the first direction, by an insulating wall extending in the first direction, and the method comprising:

forming a first stack and a second stack separated by a trench extending in the first direction, each stack comprising a nanosheet intermediate a pair of sacrificial layers, wherein each nanosheet is formed of a channel material and each sacrificial layer is formed a sacrificial material;

forming a recess in the first and second stacks, between the respective pairs of sacrificial layers, comprising etching back a respective inner sidewall surface of the nanosheets from the trench;

forming the insulating wall between the first stack and the second stack, comprising depositing an insulating material filling the trench and the recesses;

forming a sacrificial gate extending across the first stack, the insulating wall, and the second stack, thereby defining:

at the first stack, a channel region of the first nanosheet transistor structure, and a source and a drain region of the first nanosheet transistor structure on either side of the channel region, and at the second stack, a channel region of the second nanosheet transistor structure, and a source and a drain region of the second nanosheet transistor structure on either side of the channel region;

removing, from the first and second stacks in said source and drain regions, the sacrificial material and the channel material by etching;

forming by epitaxy in the source and drain regions, the source and the drain of the first nanosheet transistor structure, and the source and the drain of the second nanosheet transistor structure;

removing the sacrificial gate, thereby exposing the first and the second stacks in the respective channel regions;

forming a respective channel portion of the first and second nanosheet transistor structure, comprising removing sacrificial material from the first and second stacks in the respective channel regions to expose upper and lower surfaces of a nanosheet portion of the respective nanosheets, each nanosheet portion having an etched-back inner sidewall surface abutting the insulating wall; and forming a respective gate stack for the first and second nanosheet transistor structures, wherein the nanosheet portion of the first nanosheet transistor structure extends through the first gate stack and the nanosheet portion of the second nanosheet transistor structure extends through the second gate stack.

The above discussion of details and advantages in connection with the first aspect applies correspondingly to the second aspect.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Methods for forming a first and a second NSH transistor structure will now be described with reference to the drawings. Due to the fork-like cross-sectional shape of the gate stacks, the structures may be referred to as "forksheet" (FSH) transistor structures, more specifically FSH field-effect transistors (FSH-FETs).

Figures 1, 2:
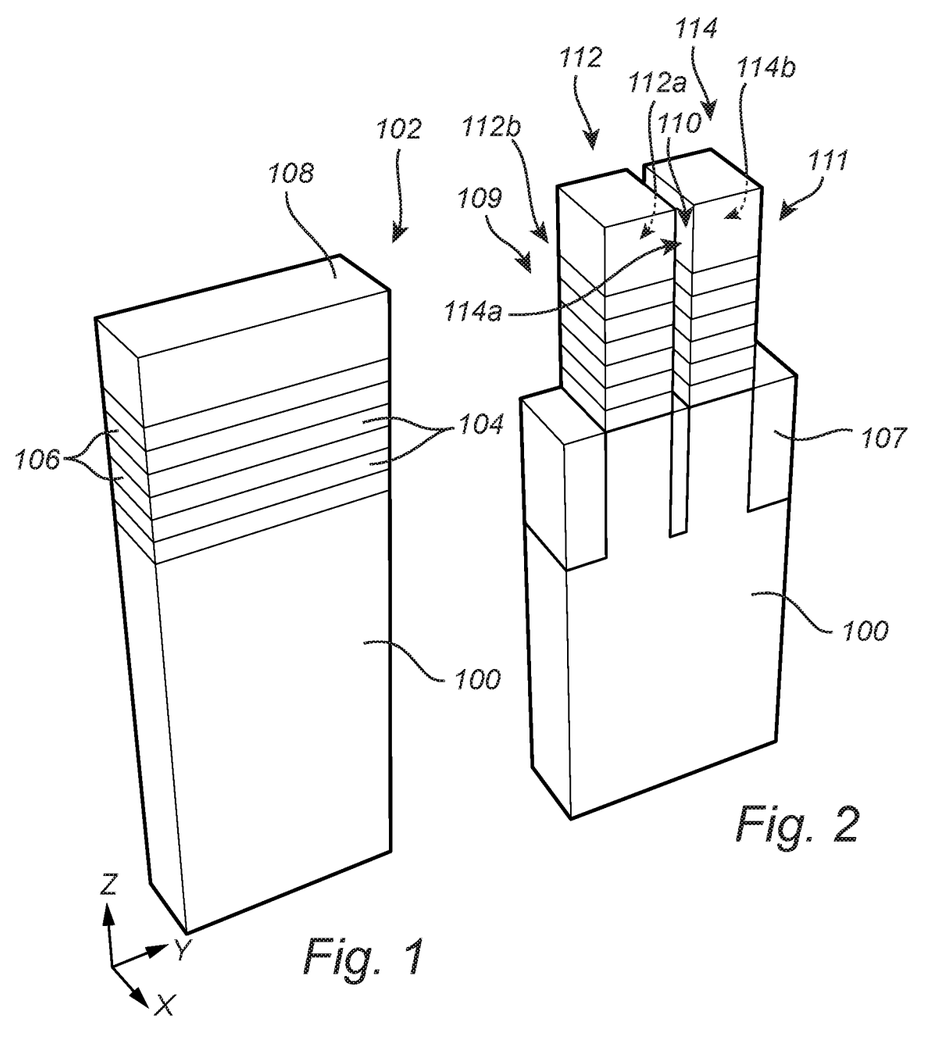
FIGS. 1-14 illustrate a method of forming a semiconductor device.

FIG. 1 shows in perspective a section of a substrate 100 supporting a stack of deposited layers 102 which is to be processed to form first and second NSH transistor structures, such as FSH-FETs. As may be appreciated, the substrate 100 and the stack of layers 102 may typically present a much greater lateral/horizontal extension than shown, beyond the illustrated section. It may further be noted that the relative dimensions of the shown structures, for instance the relative thickness of layers, is merely schematic and may, for the purpose of illustrational clarity, differ from a physical device structure. In FIG. 1, directions X and Y indicates a first and a second horizontal direction, respectively (parallel to a main plane of extension and a main surface of the substrate 100). Direction Z indicates a vertical direction, or equivalently a bottom-up direction or layer stacking direction (normal to the main plane of extension and the main surface of the substrate 100).

The substrate 100 may be of a conventional type, such as a substrate suitable for complementary metal-oxide semiconductor (CMOS) processing. The substrate 100 may for instance be a semiconductor substrate such as a Si substrate, a germanium (Ge) substrate or a silicon-germanium (SiGe) substrate. Other examples include a semiconductor-on-insulator (SOI) type of substrate such as a Si-on-insulator substrate, a Ge-on-insulator substrate or a SiGe-on-insulator substrate.

As further shown in FIG. 1, a stack of layers 102 has been formed on the substrate 100. The stack of layers 102 is formed of alternating first layers 104 of a channel material ("channel layers 104"), and second layers 106 of a sacrificial material ("sacrificial layers 106"). The layer 108 of the stack 102 designates a topmost sacrificial layer of the stack 102, also formed of the sacrificial material.

The stack of layers 102 may be formed by alternatingly depositing the channel material to form a channel layer 104 and sacrificial material to from a sacrificial layer 106. The channel material and the sacrificial material may be deposited to form epitaxial layers, e.g. by chemical vapor deposition (CVD) or any other conventional suitable deposition method.

The channel material may be silicon Si, and the sacrificial material may be SiGe. Alternatively, the channel material may be SiGe and the sacrificial material may be Si. Alternatively, the channel material may be Ge and the sacrificial material may be silicon germanium (SiGe). Alternatively both the channel material and the sacrificial material may be SiGe layers however of different composition. For instance the channel material may have a lower Ge-content than the sacrificial material. For Si- and Ge-based channel and sacrificial materials, a difference in Ge-content may for example be at least 20 percentage units.

In FIG. 2, the stack of layers 102 has been patterned to form a first stack 112 and a second stack 114. The patterning may comprise etching trenches 109, 110, 111 extending along the first direction X. Either single- or multiple-patterning techniques may be employed, e.g. self-aligned double patterning (SADP) or quadruple patterning (SAQP).

The trench 110 separates the first stack 112 from the second stack 114. Each one of the stacks 112, 114 has a length dimension along the first direction X and a width dimension along the second direction Y. Each stack 112, 114 has a pair of mutually opposite sidewall surfaces 112a, 112b and 114a, 114b respectively. The sidewall surfaces 112a and 114a face the trench 110 and may in the following be referred to as "inner sidewall surfaces" 112a, 114a. The sidewall surfaces 112b and 114b face away from the trench 110 and may in the following be referred to as "outer sidewall surfaces" 112b, 114b. A distance between the inner and outer sidewall surfaces 112a, 112b defines a width dimension of the stack 112 and the layers 104, 106, 108 thereof. A distance between the inner and outer sidewall surfaces 114a, 114b defines a width dimension of the stack 114 and the layers 104, 106, 108 thereof.

The trench 110 may be formed to extend along an intended boundary between a first device region and a second device region. The first and second device regions may be regions in which p- and n-type devices, respectively, are to be formed. Hence, the position of the trench 110 may determine a position of a PN boundary between the first and second NSH transistor structures e.g. FSH-FETs, to be formed. The trench 110 may for example be formed with a width in a range from 5 nm to 20 nm.

The trenches 109, 110, 111 may as shown extend completely through the stack of layers 102, into an underlying thickness portion of the substrate 100. Lower trench portions formed in a thickness portion of the substrate 100 may be filled with an insulating material 107 (e.g. an oxide such as silicon oxide or a conventional gap fill dielectric, deposited e.g. by ALD, CVD, spin-coating) to form shallow-trench-isolation (STI), to provide electrical insulation between the stacks.

As may be appreciated, further stacks similar to the stacks 112, 114 may be formed outside the region depicted in FIG. 2. For example, the trench 109 may separate the stack 112 from a further not shown stack. Correspondingly, the trench 111 may separate the stack 114 from a further not shown stack. The widths of the trenches 109, 111 may typically be greater than the width of the trench 110.

The stacks 112, 114 may be patterned such that the channel layers 104 assume the shape of nanosheets 104 ("channel nanosheets 104"). A nanosheet may generally have a width dimension exceeding a thickness (along the vertical direction Z). A nanosheet may for example be formed with a width of in a range from 10 nm to 30 nm and a thickness in a range from 3 nm to 8 nm. As shown, one or more of the sacrificial layers 106 may also assume the shape of nanosheets 106 ("sacrificial nanosheets 106"), depending on their thickness. For instance, for the stacks 112, 114 shown, all sacrificial layers 106 but the topmost layer 108 may subsequent to the patterning be referred to as nanosheets. However also the topmost layer 108 may be formed as a nanosheet.

Figure 3:
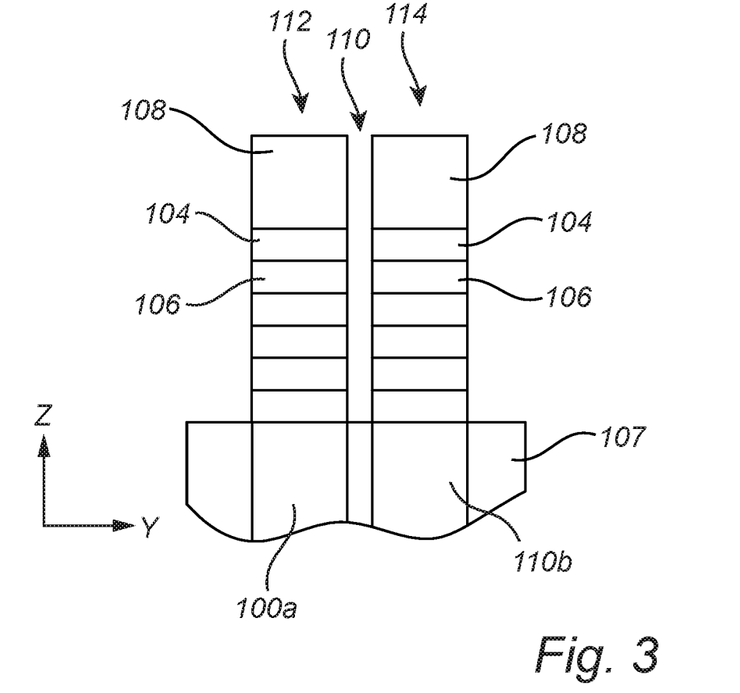

FIG. 3 shows cross-sections of the stacks 112, 114 on respective (patterned) portions 100a, 100b of the substrate 100.

Figure 4:
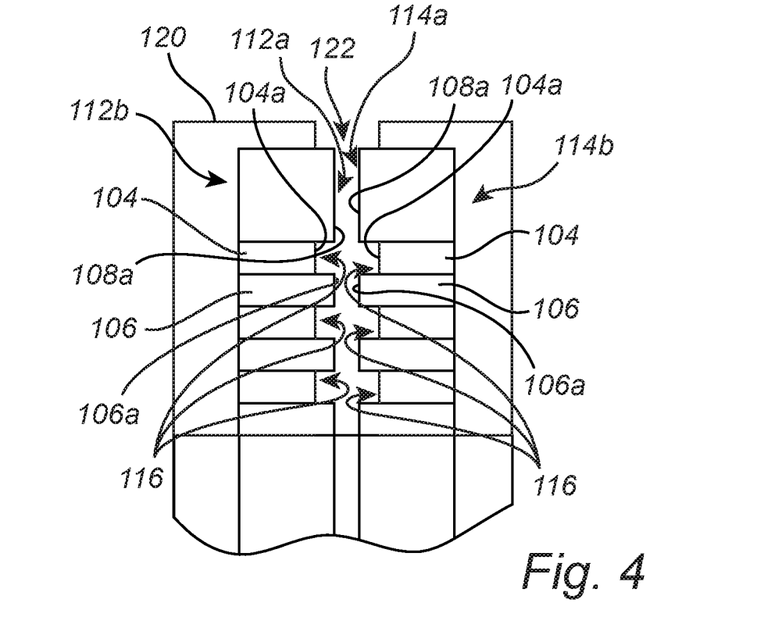

In FIG. 4 a number of recesses 116 have been formed in the first and second stacks 112, 114. Each recess 116 is formed between a respective pair of sacrificial layers 106, 108. Forming the recesses 116 may comprise performing an etch back of a respective inner sidewall surface 104a of the nanosheets which face the trench 110. The inner sidewall surfaces 104a may be etched back from sides 112a, 114a facing the trench 110.

The recesses 116 may be formed by etching the channel material selectively to the sacrificial material. Accordingly, the inner sidewall surfaces 104a of the channel nanosheets 106 may be etched back (horizontally or laterally) in relation to inner sidewall surfaces 106a, 108a of the sacrificial layers 106, 108. The recesses 116 may for instance be formed with a depth (along the second direction Y) in the range of 1 nm to 4 nm or greater. The amount of etch back may for example depend on a thickness of one or more gate dielectric layers of the gate stacks which are to be formed.

The etch may be an etch providing at least a lateral etching component, i.e. a non-zero lateral etch rate of the channel material. Either wet or dry etching chemistries may be used. For instance, an HCl-based vapor etch or an $NH_4OH$-based wet etch may be used.

To avoid etch back of the channel nanosheets 106 from the outer sidewall surfaces 112b, 114b, the outer sidewall surfaces 112b, 114b may be masked during the etch back, for example using an etch mask 120 defining an opening 112 over the trench 110. However, if a dual-sided etch back of the channel nanosheets 106 is desired, the etch mask 120 may be omitted.

Figures 5A, 5B:
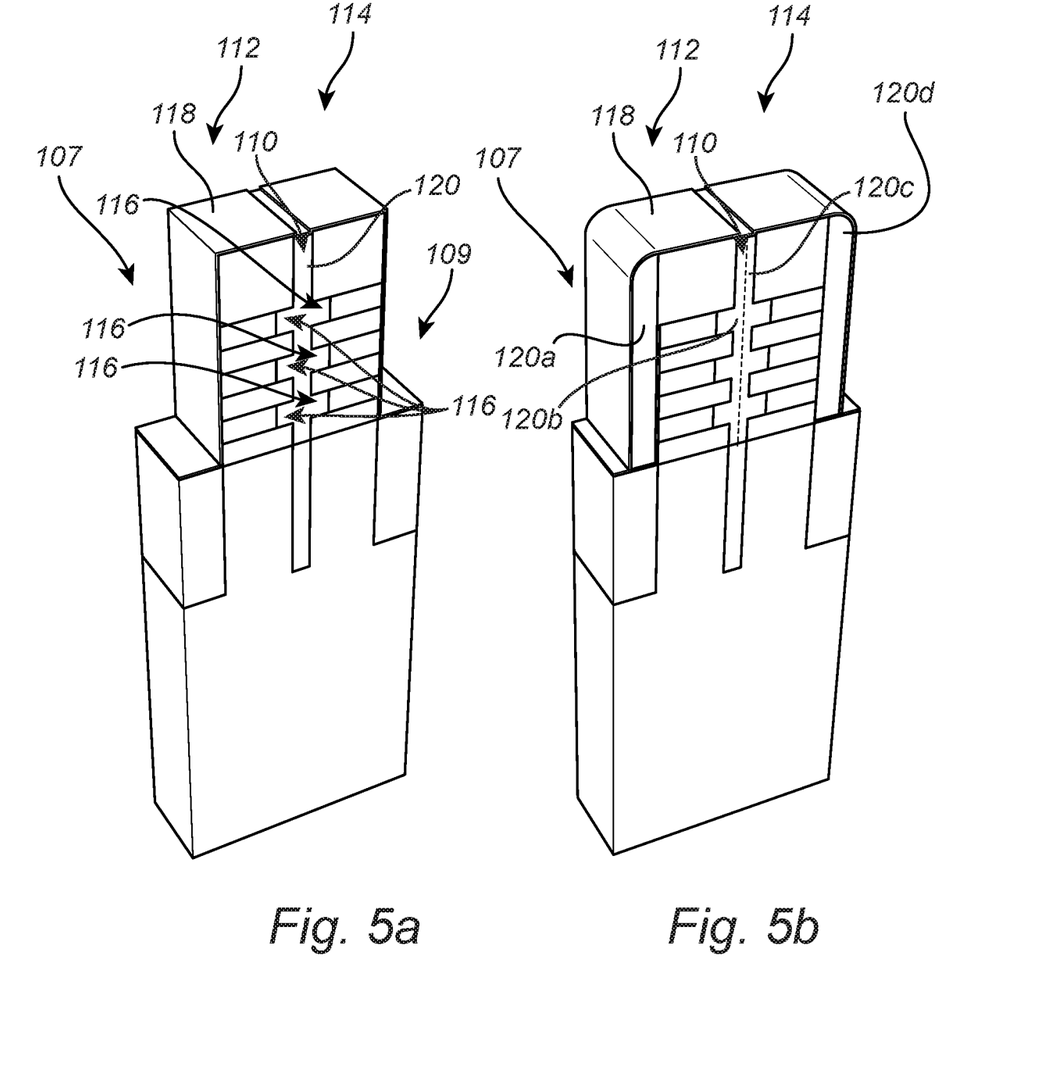

In FIG. 5a, an insulating wall 120 has been formed between the first stack 112 and the second stack 114. An insulating material has been deposited, filling the trench 110 and the recesses 116.

The insulating material may be conformally deposited over the first and second stacks 112, 114 (and over the dummy oxide layer 118 if present) before being isotropically etched to remove the deposited insulating material outside the trench 110. The insulating material may be deposited with a thickness such that the insulating material deposited at the respective sidewalls of the first and second stacks 112, 114 facing the trench 110 join to "close" and thus fill the trench 110. By the isotropic etching (i.e. an etching process providing lateral and vertical etch rates of comparable or substantially equal magnitudes) the insulating material may be removed from horizontally oriented surfaces and vertically oriented surfaces outside of the trench 110 (including the sidewalls of the stacks 112, 114 facing away from the trench 110), but preserved in the "closed" trench 110. As may be appreciated, the insulating material filling the trench 110 may be subjected to an etch back (top-down) by an amount corresponding to the thickness of the conformally deposited insulating material outside of the trench 110, provided the isotropic etching is stopped when the insulating material has been removed outside of the trench 110. The insulating material may for instance be a nitride- or oxide-comprising material, advantageously of a high-k, such as SiN, SiCO, SiCN or SiOCN. The insulating material may be deposited conformally by e.g. ALD or CVD.

FIG. 5b shows an alternative manner of forming the insulating wall 110, also comprising a conformal deposition of insulating material over the first and second stacks 112, 114, but instead followed by anisotropically (top-down) etching the deposited insulating material to form sidewall spacers 120a, 120b, 120c, 120d on the stack sidewalls 112a, 114a facing the trench 110, and on the mutually opposite stack sidewalls 112b, 114b facing away from the trench 110. The insulating material may be deposited with a thickness such that the sidewall spacers 120b, 120c at the sidewalls of the first stack 112 and the second stack 114, respectively, join to close and thus fill the trench 110.

As further shown in FIGS. 5a and 5b, a (dummy) liner 118 (e.g. an insulating liner such as an oxide) may optionally be formed over the insulating material 107 and the stacks 112, 114 subsequent to forming the insulating wall 120. Additionally or alternatively, a (dummy) liner may be formed prior to depositing the insulating material closing the trench 110. Accordingly, forming the insulating wall 120 may comprise depositing a liner and subsequently an insulating material (e.g. high-k dielectric such as SiN, SiCO, SiCN or SiOCN) closing the trench 110. In this case the (final) insulating wall 120 may accordingly comprise an (outer) liner (formed by liner portions on the inner sidewalls of the stacks 112, 114) and the (subsequently deposited) insulating material (e.g. insulating trench fill material). A liner may for example be a thermally deposited or ALD-deposited oxide, such as silicon oxide.

Further stacks may be present on the opposite sides of the trenches 107, 109, as discussed above. The widths of the trenches 109, 111 may however be greater than the width of the trench 110 such that the trenches 109, 111 are not "closed" by the deposited insulating material. Hence, the insulating material may be removed outside the trench 110 by isotropic etching (as in FIG. 5a) or by anisotropic etching (as in FIG. 5b to remove the insulating material from horizontally oriented surfaces).

In the following it will be assumed the insulating wall 120 has been formed in accordance with FIG. 5a. As may be understood the following process steps are however equally compatible with an insulating wall formed in accordance with FIG. 5b.

Figure 6:
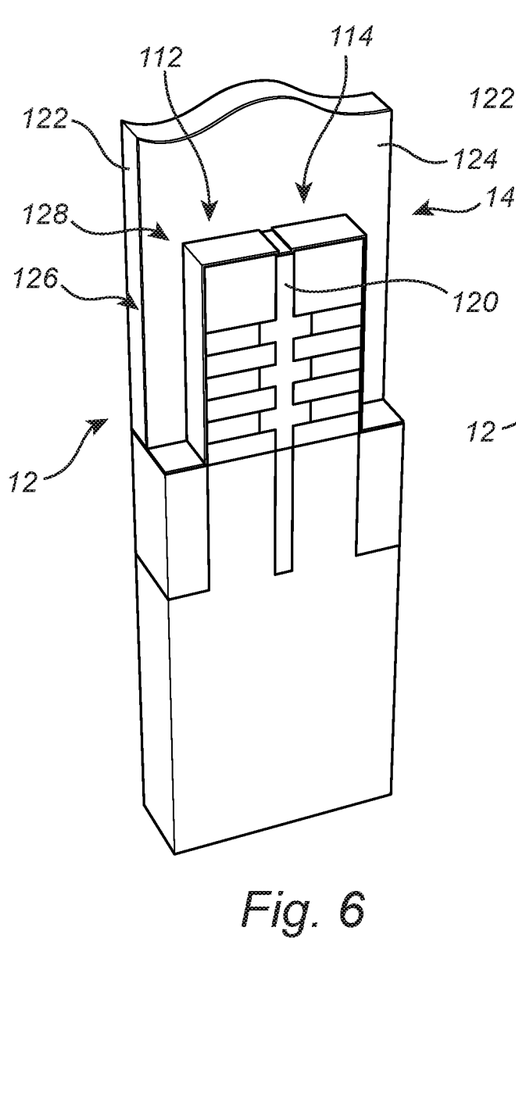

In FIG. 6, a sacrificial gate 122 is formed extending across the first and second stacks 112, 114, and across the insulating wall 120. A preliminary or intermediate first and second NSH transistor structure 12, 14 comprising the sacrificial gate 122 and the first and second stacks 112, 114, respectively, may accordingly be formed. FIG. 6 shows the NSH transistor structures 12, 14 from only one side of the sacrificial gate 122. The view is however representative of the structure on both sides of the sacrificial gate 122.

The sacrificial gate 122 may for example be formed of amorphous silicon (aSi) or polysilicon, and may for example be formed by means of CVD followed by patterning, in a manner which per se is known in the art. A gate spacer 124 may as further shown in FIG. 6 be formed along the sidewalls of the sacrificial gate 122, e.g. by a conformal gate spacer layer deposition (e.g. by ALD) followed by a (top-down) anisotropic etch. FIG. 6 shows a single sacrificial gate structure comprising the sacrificial gate 122 and the gate spacer 124. However, a plurality of such sacrificial gates and sacrificial gate structures may be formed to extend in parallel across the first and second stacks 112, 114 to allow forming of plural NSH transistor devices.

The sacrificial gate 122, or the sacrificial gate structure, defines, by its overlap with the first and second stacks 112, 114, a respective channel region 126 of the first and second NSH transistor structures 12, 14 (and accordingly of the final FSH-FETs). Respective source and drain regions, commonly referenced source/drain regions 128, are defined on either side of the respective channel regions (i.e. regions not covered by the sacrificial gate 122/sacrificial gate structure).

If further stacks are present on the substrate 100 on opposite sides of the insulating wall 120, as discussed above, the sacrificial gate 122, or the sacrificial gate structure, may be formed to extend across a number of such stacks, thus defining channel regions (and source/drain regions) of a number of NSH transistor structures on opposite sides of the insulating wall 120.

Figure 7:
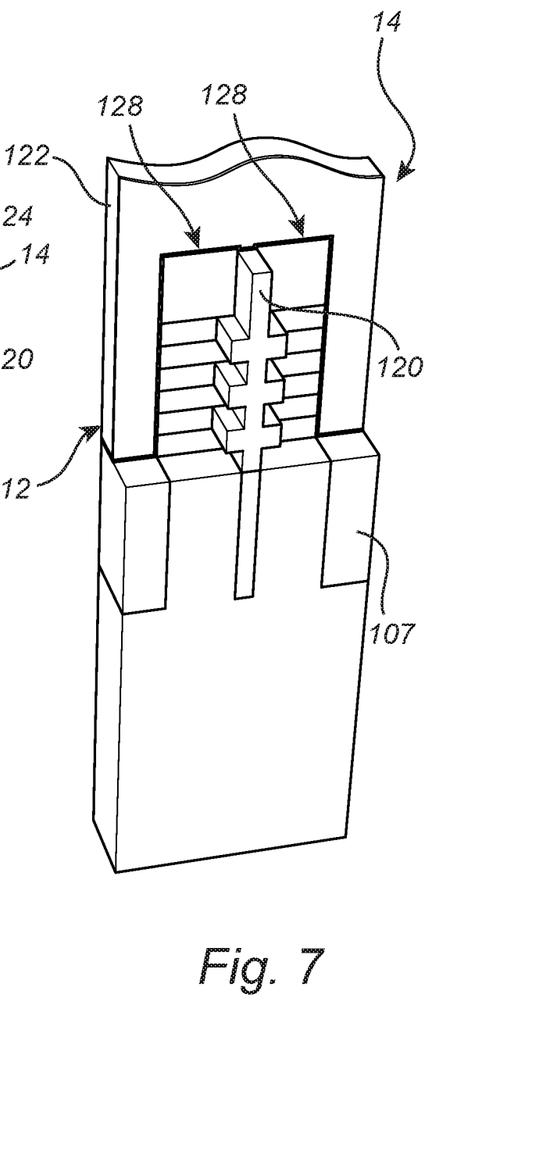

In FIG. 7, upper surfaces of the first stack 112 and the second stack 114 have been recessed or etched back while using the sacrificial gate structure 122, 124 as an etch mask. Cuts extending through the first stack 112 and the second stack 114 have hence been formed on either sides the sacrificial gate 122 in the source/drain regions 128. The etch back may as shown proceed until the upper surfaces have been recessed to a level of the STI 107 and then stopped. By this approach, both the channel material and the sacrificial material may be removed in the source/drain regions 128 prior to forming the sources and drains. A dry etch such as RIE may be used to anisotropically etch back the first and second stacks 112, 114 in the source/drain regions 128. The dry etch may be adapted to anisotropically etch back the first and second stacks 112, 114 in a top-down direction such that undercutting the sacrificial gate 122 is avoided or at least minimized. An optional wet etch may subsequently be applied to remove any residual semiconductor material shadowed by the overhangs of the insulating wall 120 during the preceding dry etch.

Figure 8:
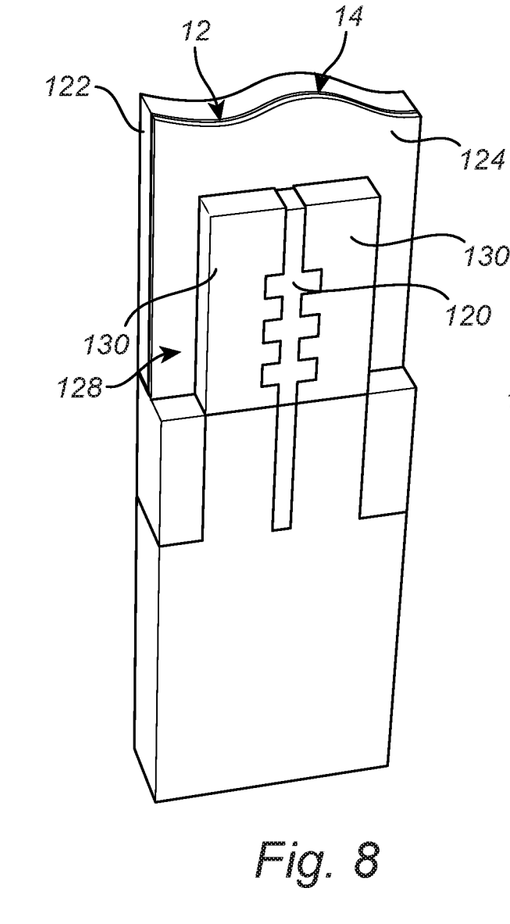

In FIG. 8, source and drain, commonly referenced source/drain 130, have been formed in the source/drain regions 128. Although the NSH transistor structures 12, 14 are visible from only one side of the sacrificial gate 122 in FIG. 8, it should be understood that a source and a drain are formed on opposite sides of the channel region 126 at the first stack 112, and on opposite sides of the channel region 126 at the second stack 114. Each source/drain 130 may be formed by an epitaxially grown semiconductor body. The source/drain 130 may be grown on exposed surfaces of the channel layers 104 on either side of the sacrificial gate 122. In FIG. 8, where the source and drain formation has been preceded with forming cuts in the source/drain regions 128, each source/drain 130 may be epitaxially grown on end surfaces of the channel layers 104.

For instance, Si or SiGe selective area epitaxy may be performed on the end surfaces of the channel layers 104, in accordance with the selected type of channel material. Each source/drain 130 may be doped in accordance with the desired conductivity type, for instance through in-situ doping. Alternatively or additionally, implantation doping or diffusion doping may be employed. The source/drain 130 at the first stack 112 may be doped with a p-type dopant and the source/drain 130 of at the second stack 114 may be doped with an n-type dopant. In an example, the source/drain 130 at the second stack 114 is formed by an n-doped selective epitaxial silicon deposition process, using for instance P, As or Sb as dopants, whereas the source/drain 130 at the first stack 112 is formed by a p-doped selective epitaxial silicon or SiGe deposition process, using for instance B or Ga as dopants.

The n-doped regions and the p-doped regions may be formed sequentially, such that the n-epitaxy is performed while the p-doped region is masked, and vice versa. Advantageously, the insulating wall 120 may facilitate separation between the n- and p-type source/drains.

If further stacks are present on the substrate 100 on opposite sides of the insulating wall 120, as discussed above, recessing in the source/drain regions may simultaneously be effected also on these further stacks. Subsequently, sources and drains may be formed by performing epitaxy in the source/drain regions of the NSH transistor structures. For example, p-doped sources and drains may be formed in the source/drain regions of the NSH transistor structures on a same side of the insulating wall 120 as the first NSH transistor structure 12. Correspondingly, n-doped sources and drains may be formed in the source/drain regions of the NSH transistor structures on a same side of the insulating wall 120 as the second NSH transistor structure 14.

FIG. 9-14 illustrate the formation of gate stacks in the channel regions of the first and second NSH transistor structures 12, 14. The FIGS. 9-14 show cross sections taken across the channel regions 126, subsequent to removing the sacrificial gate 122 to expose the first stack 112 in a first gate trench 132 and the second stack 114 in a second gate trench 134, and thus behind the mask layer 124 as seen from the source/drain 130 of FIG. 8. The sacrificial gate 122 may be removed e.g. using a suitable wet etching process.

Figure 9:
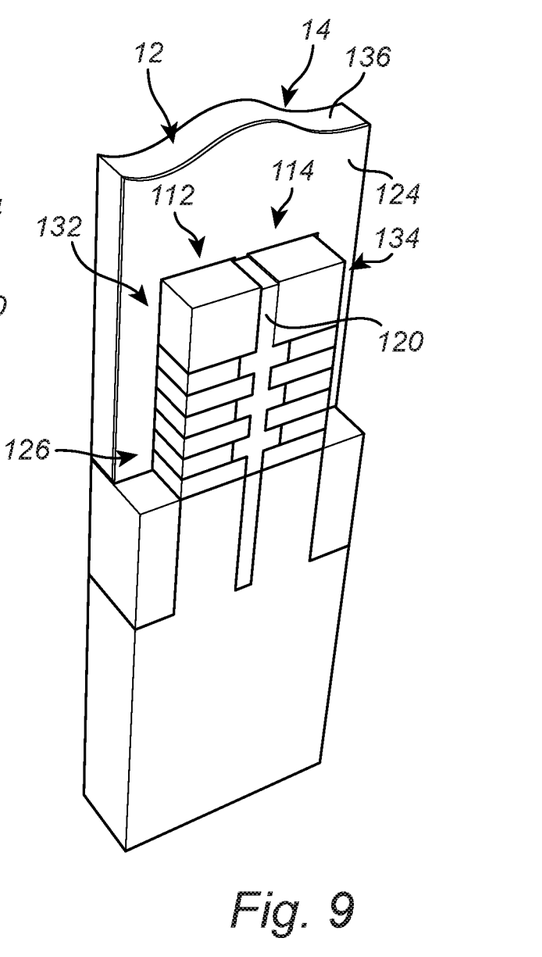

Prior to removing the sacrificial gate 122, a cover material 136 may be deposited to cover the source/drains 130 and surround the sacrificial gate structure 122, 124 on either side. The cover material 136 may be an insulating material, such as an oxide, e.g. silicon oxide, or another gap fill dielectric material, deposited and recessed, e.g. by chemical mechanical polishing (CMP) and/or etch back to reveal an upper surface of the sacrificial gate (s) 122. Subsequent to depositing the cover material 136, the sacrificial gate 122 may be removed to expose the first and second stacks 112, 114 in the first and second gate trench, 132, 134, respectively.

Figure 10:
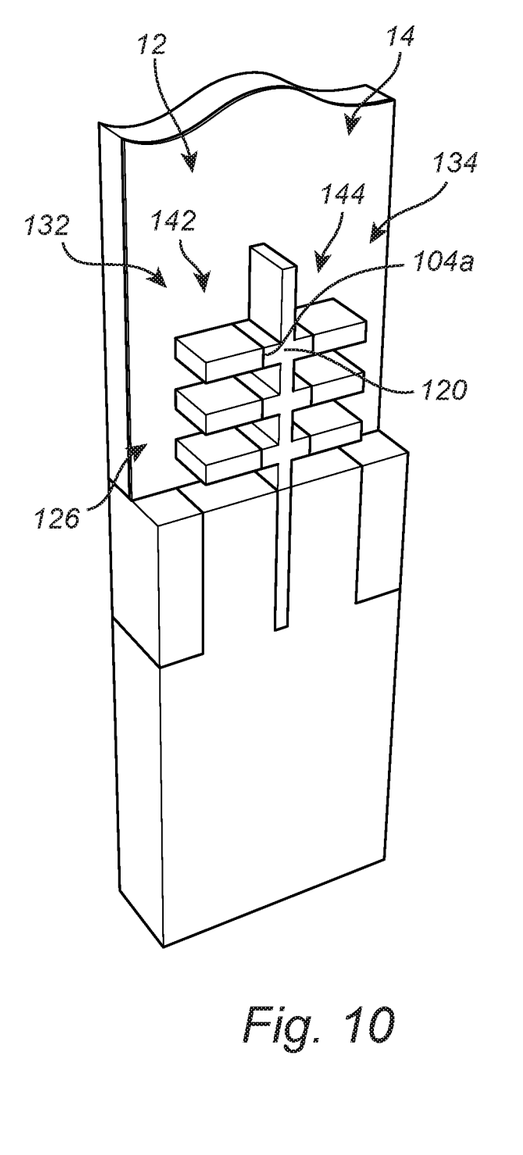

In FIG. 10, the sacrificial layers 106, 108 of the first and the second stacks 112, 114 have been removed to "release" portions of the channel layers 104 within the gate trenches 132, 134. A number of vertically stacked lateral/horizontal NSH channel portions 142, 144 of the first and second NSH transistor structures 12, 14 may thereby be formed. More specifically, the sacrificial material may be removed (by etching) from the first stack 112 and the second stack 114 in the channel regions 126. Upper and lower surfaces of the NSH channel portions 142, 144 may thereby be exposed within the channel regions 126.

As may be seen from the figure, the channel portions 142, 144 are "partly released" in the sense that their upper and lower surfaces as well as outer sidewall surfaces are laid bare while their (etched-back) inner sidewall surfaces 104a (i.e. facing the insulating wall 120) are not laid bare but abut (and hence are covered by) the insulating wall 120.

Figure 11:
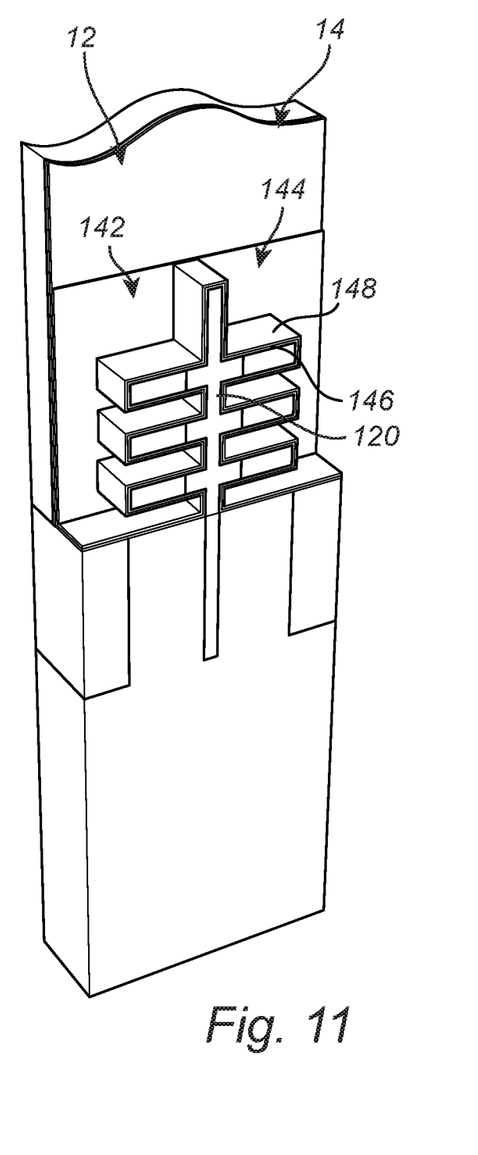

In FIG. 11, a high-k dielectric material 146, such as HfO2, HfSiO, LaO, AlO or ZrO, has been deposited at the released channel portions 142, 144 to form a gate dielectric. Further, a p-type work function metal (p-WFM) 148, such as TiN, TaN or mixtures thereof, has been deposited covering the high-k material 146 at the channel portions 142, 144. The deposition of the p-WFM 148 may for example be followed by an etch-back step, in which the p-WFM 148 is recessed to a level below, at or slightly above an upper surface of the insulating wall 120. A mask layer may be deposited, such as SoC or other organic spin-on, and etched back for instance by dry etching to a target level. The etched back mask layer may then be used as a mask while p-WFM on surfaces above the target level (such as surfaces outside of the gate trenches 132, 134) is removed by for example isotropic etching.

Figure 12:
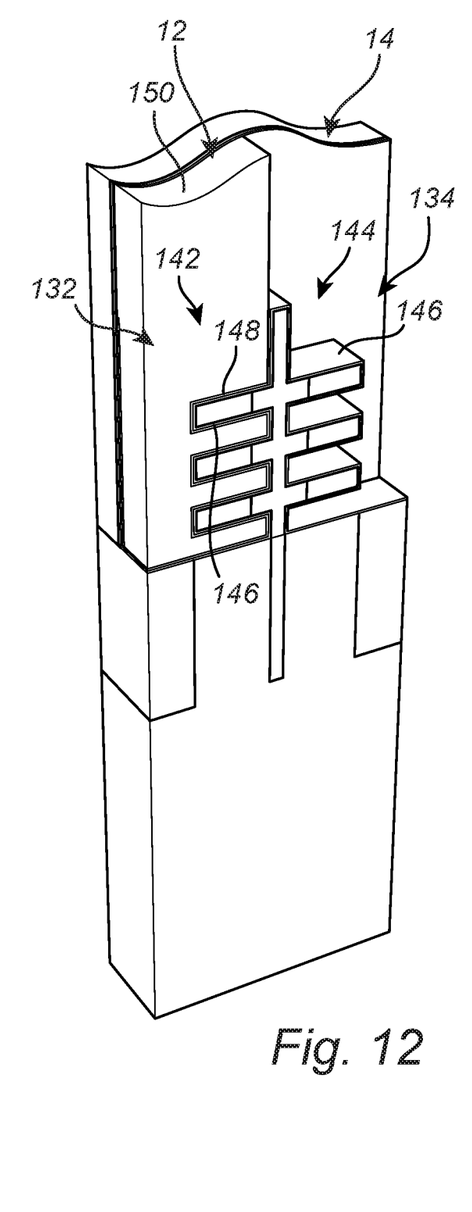

In FIG. 12, the p-WFM has been selectively removed from the channel portions 144 of the second NSH transistor structure 14, by etching the p-WFM while a mask 150 counteracts removal of the p-WFM 148 at the channel portions 142 of the first NSH transistor structure 12. In the figure the mask 150 does not cover a full width of the insulating wall 120, rather the wall 120 may act as part of a combined etch mask together with the mask 150, thus counteracting both vertical and lateral etching of the p-WFM in the first gate trench 132. In other words, the wall 120 may provide a buffer zone wherein, as long as the mask 150 at least partially overlaps the insulating wall 120 in the width direction (of the wall 120), the p-WFM etch may be confined to the second gate trench 134.

Figure 13:
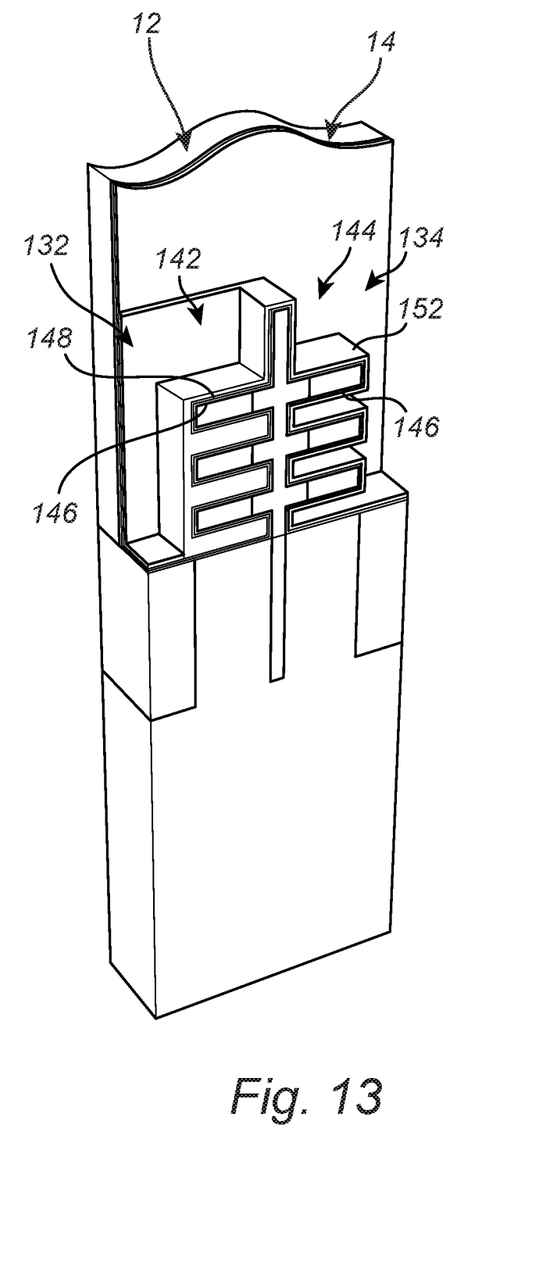

In FIG. 13, an n-type work function metal (n-WFM) 152, such as TiAl or TiAlC, has been conformally deposited at the channel portions 142 (on the p-WFM in the first gate trench 132) and at the channel portions 144 (on the gate dielectric 146 in the second gate trench 134).

Figure 14:
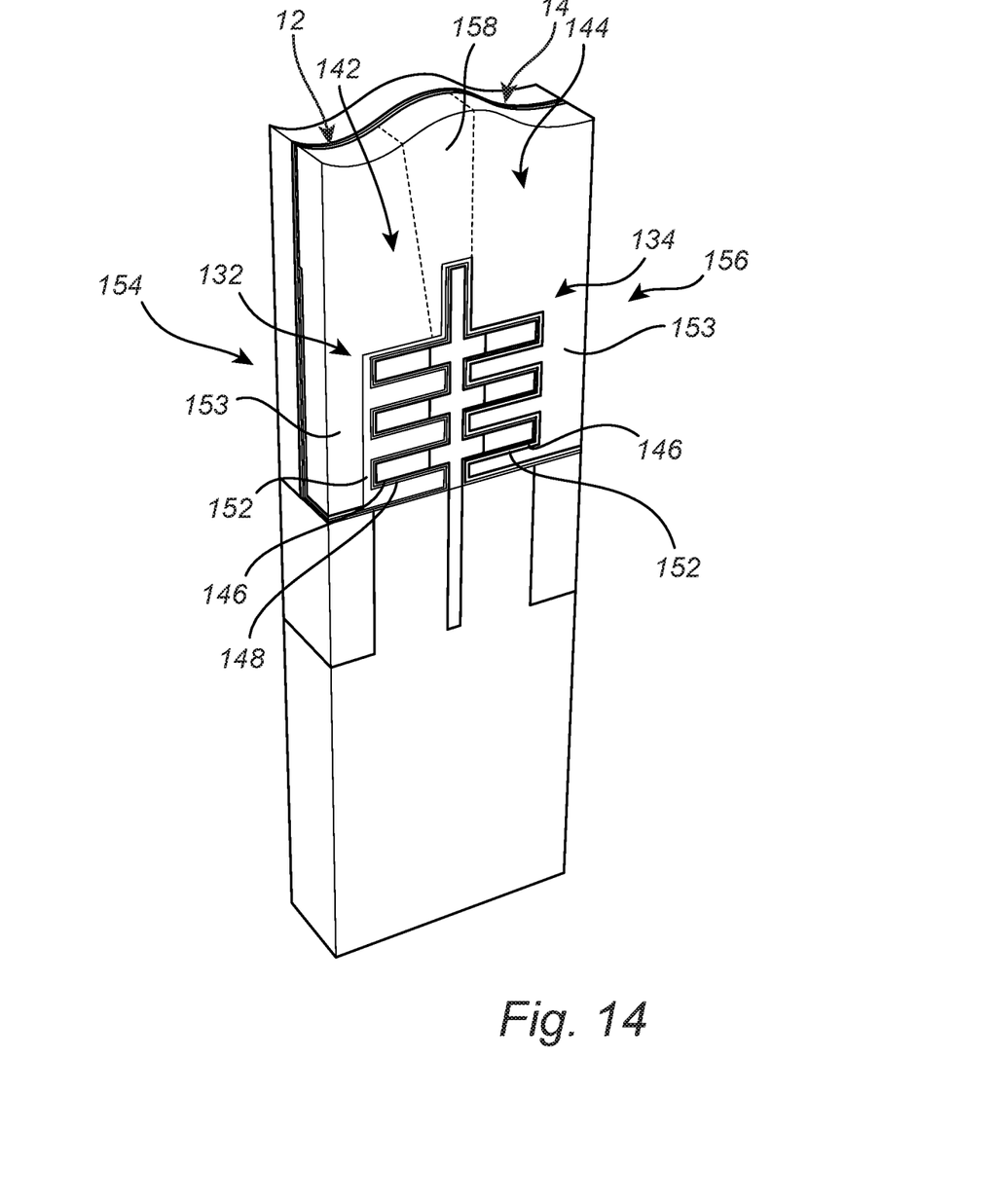

In FIG. 14, a gate fill metal 153 has been deposited on the n-WFM 152. The gate fill metal may be deposited to fill a remaining space in the gate trenches 132, 134. The gate fill metal may for instance be deposited by CVD or PVD. Possible metals include W, Al, Co or Ru. The gate fill metal may subsequently be etched back to obtain final gate stacks 154, 156 of a desired height.

The gate fill metal may as shown extend uninterrupted between the gate trenches 132, 134. The gate structures 154, 156 of the first and second NSH transistor structures 12, 14 may accordingly be electrically connected. In other words, the gate stacks 154, 156 may designate electrically connected parts of a common gate structure, on either side of the opposite insulating wall 120. This may be suitable configuration for e.g. a CMOS inverter. As further indicated in FIG. 14, it is however also possible to etch back the gate metals in a region above the insulating wall 120 to divide the gate metals into two electrically separate gate stacks 154, 156. The gap between the gate stacks 154, 156 may be filled with an insulating material 158, such as a CVD deposited oxide, e.g. silicon oxide, or another lower-k dielectric.

Accordingly, following either approach, a first gate stack 154 for the first NSH transistor structure 10 and a second gate stack 156 for the second NSH transistor structure 12 may be formed. The first gate stack 154 comprises the gate dielectric 146, the p-WFM 148, the n-WFM 152 and the gate fill metal 153. The second gate structure 156 comprises the gate dielectric 146, the n-WFM 152 and the gate fill metal 153. The channel portions 142 extend through/are partially enclosed by the first gate stack 154. The channel portions 144 extend through/are partially enclosed by the second gate stack 156.

The fork-like shaped portions of the gate stacks 154, 156, with a number of prongs extending along and between the nanosheets of the respective NSH channel portion stacks 142, 144 may be seen in FIG. 14.

As further may be seen in FIG. 14, by the preceding lateral etch back of the channel layers 104 (which may match or exceed a thickness of the gate dielectric 146) an extension of the p-WFM and n-WFM along the width direction of the NSH channel portions may be increased, thereby allowing improved channel control. Meanwhile, the insulating wall 120 may provide physical and electrical isolation between the NSH transistor structures 12, 14 and optionally also between the associated first and second gate stacks 154, 156.

The method may proceed with contact formation (for the gate stacks 154, 156 and the source/drains 130) and routing layer formation, as per se is known in the art, to incorporate the FSH-FETs into a functioning circuit.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method for forming a first and a second nanosheet transistor structure, each comprising a source, a drain, and a channel extending between the source and the drain in a first direction, and a gate extending across the channel, wherein the first and second nanosheet transistor structures are spaced apart in a second direction, transverse to the first direction, by an insulating wall extending in the first direction, and the method comprising:
   forming a first stack and a second stack separated by a trench extending in the first direction, each stack comprising a nanosheet intermediate a pair of sacrificial layers, wherein each nanosheet is formed of a channel material and each sacrificial layer is formed a sacrificial material;
   forming a recess in the first and second stacks, between the respective pairs of sacrificial layers, comprising etching back a respective inner sidewall surface of the nanosheets from the trench;
   forming the insulating wall between the first stack and the second stack, comprising depositing an insulating material filling the trench and the recesses;
   forming, at the first stack, the source and the drain of the first nanosheet transistor structure, and, at the second stack, the source and the drain of the second nanosheet transistor structure;
   forming a respective channel portion of the first and second nanosheet transistor structure, comprising removing sacrificial material from the first and second stacks to expose upper and lower surfaces of a nanosheet portion of the respective nanosheets, each nanosheet portion having an etched-back inner sidewall surface abutting the insulating wall; and
   forming a respective gate stack for the first and second nanosheet transistor structures, wherein the nanosheet portion of the first nanosheet transistor structure extends through the first gate stack and the nanosheet portion of the second nanosheet transistor structure extends through the second gate stack.

2. A method according to claim 1, wherein each gate stack comprises one or more gate dielectric layers, wherein each of the inner sidewall surfaces is etched back by a distance equal to or exceeding a thickness of the one or more gate dielectric layers.

3. A method according to claim 1, wherein forming the recesses comprises etching back the inner sidewall surfaces while masking a sidewall surface of the first stack facing away from the trench and a sidewall surface of the second stack facing away from the trench.

4. A method according to claim 1, further comprising:
   prior to forming the sources and drains, forming a sacrificial gate extending across the first stack, the insulating wall, and the second stack, thereby defining a channel region of the first nanosheet transistor structure at the first stack and a channel region of the second nanosheet transistor structure at the second stack; and
   prior to forming the channel portions, removing the sacrificial gate.

5. A method according to claim 4, wherein forming the channel portions comprises removing the sacrificial material from the stacks in the channel regions.

6. A method according to claim 4, wherein a source region and a drain region of the first nanosheet transistor structure is defined at the first stack on either side of the sacrificial gate, and a source region and a drain region of the second nanosheet transistor structure is defined at the second stack on either side sacrificial gate, wherein the source and drain of the first nanosheet transistor structure are formed in the source and drain region, respectively, of the first nanosheet transistor structure, and the source and drain of the second nanosheet transistor structure are formed in the source and drain region, respectively, of the second nanosheet transistor structure.

7. A method according to claim 4, further comprising, on either side of the sacrificial gate, removing, from the first and second stacks, the sacrificial material and the channel material by etching.

8. A method according to claim 7, further comprising, subsequent to removing the sacrificial material and the channel material, forming the respective source and drain of the first and second transistor structures on either side of the sacrificial gate by epitaxy.

9. A method according to claim 4, further comprising:
   depositing a cover material covering the sources and drains and surrounding the sacrificial gate on either side; and
   removing the sacrificial gate to expose the first stack in a first gate trench and the second stack in a second gate trench;
   wherein the gate stacks are formed in the first and second gate trenches, respectively.

10. A method according to claim 1, wherein the first nanosheet transistor structure is a p-type field effect transistor structure and the second nanosheet transistor structure is an n-type field effect transistor structure.

11. A method according to claim 10, wherein forming the gate stacks comprises:
   forming a p-type effective work function metal, WFM, at the channel portions of the first and second nanosheet transistor structures;
   removing the p-type WFM at the second channel portion while preserving the p-type WFM at the first channel portion; and
   subsequently forming an n-type WFM at the second channel portion.

12. A method according to claim 11, wherein the first and second channel portions are exposed in a first and second gate trench, respectively, formed by removing the sacrificial gate, the first and second gate trenches being separated by the insulating wall, wherein the p-type WFM is first deposited in the first and the second gate trench, and then removed from the second gate trench, and wherein the n-type WFM subsequently is deposited in at least the second gate trench.

13. A method according to claim 12, wherein removing the p-type WFM from the second gate trench comprises forming an etch mask above the first gate trench and etching the p-type WFM in the second gate trench while the etch mask and the insulating wall counteracts etching of the p-type WFM in the first gate trench.

14. A method according to claim 1, wherein each one of the first and the second stack comprises an alternating arrangement of nanosheets of the channel material and sacrificial layers of the sacrificial material.

15. A method according to claim 14, wherein at least a sacrificial layer of said sacrificial layers which is intermediate a pair of said nanosheets forms a sacrificial nanosheet.

16. A method according to claim 1, wherein the insulating wall extends to a level over the respective upper surfaces of the channel portions.

17. A method according to claim 1, wherein the channel material is silicon and the sacrificial material is silicon germanium.

18. A method according to claim 1, wherein a width of the nanosheets is in a range from 10 nm to 30 nm wherein each of the inner sidewall surfaces is etched back in a range from 1 nm to 4 nm.

19. A method according to claim 18, wherein a thickness of the nanosheets is in a range from 3 nm to 8 nm.

20. A method for forming a first and a second nanosheet transistor structure, each comprising a source, a drain, and a channel extending between the source and the drain in a first direction, and a gate extending across the channel, wherein the first and second nanosheet transistor structures are spaced apart in a second direction, transverse to the first direction, by an insulating wall extending in the first direction, and the method comprising:
   forming a first stack and a second stack separated by a trench extending in the first direction, each stack comprising a nanosheet intermediate a pair of sacrificial layers, wherein each nanosheet is formed of a channel material and each sacrificial layer is formed a sacrificial material;
   forming a recess in the first and second stacks, between the respective pairs of sacrificial layers, comprising etching back a respective inner sidewall surface of the nanosheets from the trench;
   forming the insulating wall between the first stack and the second stack, comprising depositing an insulating material filling the trench and the recesses;
   forming a sacrificial gate extending across the first stack, the insulating wall, and the second stack, thereby defining:
      at the first stack, a channel region of the first nanosheet transistor structure, and a source and a drain region of the first nanosheet transistor structure on either side of the channel region, and
      at the second stack, a channel region of the second nanosheet transistor structure, and a source and a drain region of the second nanosheet transistor structure on either side of the channel region,
   removing, from the first and second stacks in said source and drain regions, the sacrificial material and the channel material by etching;
   forming by epitaxy in the source and drain regions, the source and the drain of the first nanosheet transistor structure, and the source and the drain of the second nanosheet transistor structure;
   removing the sacrificial gate, thereby exposing the first and the second stacks in the respective channel regions;
   forming a respective channel portion of the first and second nanosheet transistor structure, comprising removing sacrificial material from the first and second stacks in the respective channel regions to expose upper and lower surfaces of a nanosheet portion of the respective nanosheets, each nanosheet portion having an etched-back inner sidewall surface abutting the insulating wall; and
   forming a respective gate stack for the first and second nanosheet transistor structures, wherein the nanosheet portion of the first nanosheet transistor structure extends through the first gate stack and the nanosheet portion of the second nanosheet transistor structure extends through the second gate stack.

* * * * *